US006399909B1

(12) United States Patent
Okada

(10) Patent No.: US 6,399,909 B1
(45) Date of Patent: Jun. 4, 2002

(54) KEYSWITCH FOR KEYBOARD

(75) Inventor: Hiroaki Okada, Kasugai (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 09/714,972

(22) Filed: Nov. 20, 2000

(30) Foreign Application Priority Data

Dec. 9, 1999 (JP) .......................................... 11-349694

(51) Int. Cl.[7] .......................... H01H 13/17; H05K 1/14

(52) U.S. Cl. .................... 200/344; 200/51 R; 400/496; 439/493

(58) Field of Search .............................. 200/344, 51 R, 200/51.02; 341/22; 400/496; 361/680, 749, 760; 439/329, 493

(56) References Cited

U.S. PATENT DOCUMENTS 4,384,796 A * 5/1983 Denley ....................... 400/496
5,117,076 A * 5/1992 Damitio ...................... 200/344
5,565,865 A * 10/1996 So ......................... 200/344 X
5,669,723 A * 9/1997 Chang .................... 200/344 X
5,718,327 A * 2/1998 Wu ............................ 200/344
5,752,851 A * 5/1998 Zaderej et al. .............. 439/493
6,072,133 A 6/2000 Takagi et al. ............... 200/344

FOREIGN PATENT DOCUMENTS

EP 267541 * 5/1988 ................. 200/344
JP A 7-283504 10/1995
JP A 10-223085 8/1998

* cited by examiner

*Primary Examiner*—Renee Luebke
(74) *Attorney, Agent, or Firm*—Oliff & Berridge, PLC

(57) ABSTRACT

A keyswitch includes a keyboard base 3, a guide support member 4 disposed on the keyboard base 3, a flexible circuit board 8 disposed on both sides of the guide support member 4 on the keyboard base 3, an elongated key top 2, and a pressing member 9 for pressing the flexible circuit board 8 toward the keyboard base 3. The pressing member 9 is disposed on both sides of the guide support member 4 directly beneath the elongated key top 2 near lengthwise ends of the elongated key top 2. When the elongated key top 2 is pressed down the guide support member 4 and the pressing member 9 are housed within the elongated key top 2.

11 Claims, 5 Drawing Sheets

KEYSWITCH FOR KEYBOARD

BACKGROUND OF THE INVENTION

1. Field of the Invention

The present invention relates to a keyswitch, a keyboard including the keyswitch, and an electronic appliance including the keyboard, and particularly to a keyswitch capable of securing a sufficient keystroke while reducing overall surface area of a keyboard base.

2. Description of the Related Art

A conventional keyboard has a keyboard base and a flexible circuit board. The keyboard base is for supporting keyswitches, including an elongated space key. The flexible circuit board is for transmitting electric signals from the keyswitches to other circuitry, for example in a personal computer. The keyboard base is printed with a contact point for each keyswitch and pull-out contacts for the flexible circuit board. Normally, the pull-out contacts are disposed at a position separate from the keyswitches.

Japanese Patent Application Publication No. HEI-7-283504 discloses locating pull-out contacts for the flexible circuit board at the position of the space key. The space key is large compared to other keys. Accordingly, the circuit pattern located at or near the space key is relatively sparse. Therefore, it is relatively easy to design the circuitry pattern on the keyboard base if the pull-out contacts are located at or near the location of the space key.

The flexible circuit board has contact points that overlap with the pull-out contacts for the flexible circuit board. A pressing member with a predetermined stiffness is provided above the flexible circuit board, to apply a uniform pressing force to the overlapping contact points, so that the flexible circuit board is brought into intimate contact with the keyboard base and attached thereto. The flexible circuit board passes through an elongated hole that is formed in the keyboard base at or near the position of the space key.

However, an elongated key, such as a space key, needs to be provided with some sort of guide support member for guiding vertical movement of the key, to ensure that a proper switching operation is performed even if pressure is applied to only one extreme end of the elongated key top. U.S. Pat. No. 6,072,133 discloses such guide support member (actuator) that extends along almost the entire length of the elongated key top, thereby ensuring that switching is properly achieved even if pressure is applied to only one extreme end of the key top.

However, with the configuration of U.S. Pat. No. 6,072,133, space must be provided on the keyboard base for fixing the flexible circuit board to the keyboard base. Therefore, overall surface area of the keyboard base must be fairly large; which increases overall size of a personal computer to which the keyboard is provided.

SUMMARY OF THE INVENTION

It is an objective of the present invention to overcome the above-described problem and provide a keyswitch capable of securing a sufficiently large keystroke, while reducing the overall surface area of the keyboard base.

DESCRIPTION OF THE DRAWINGS

The above and other objects, features and advantages of the invention will become more apparent from reading the following description of the embodiment taken in connection with the accompanying drawings in which:

FIG. 2 (*b*) is a cross-sectional view taken along line II—II of FIG. 1 with the keytop in a lowered condition;

DETAILED DESCRIPTION OF THE EMBODIMENT

Figure 1:
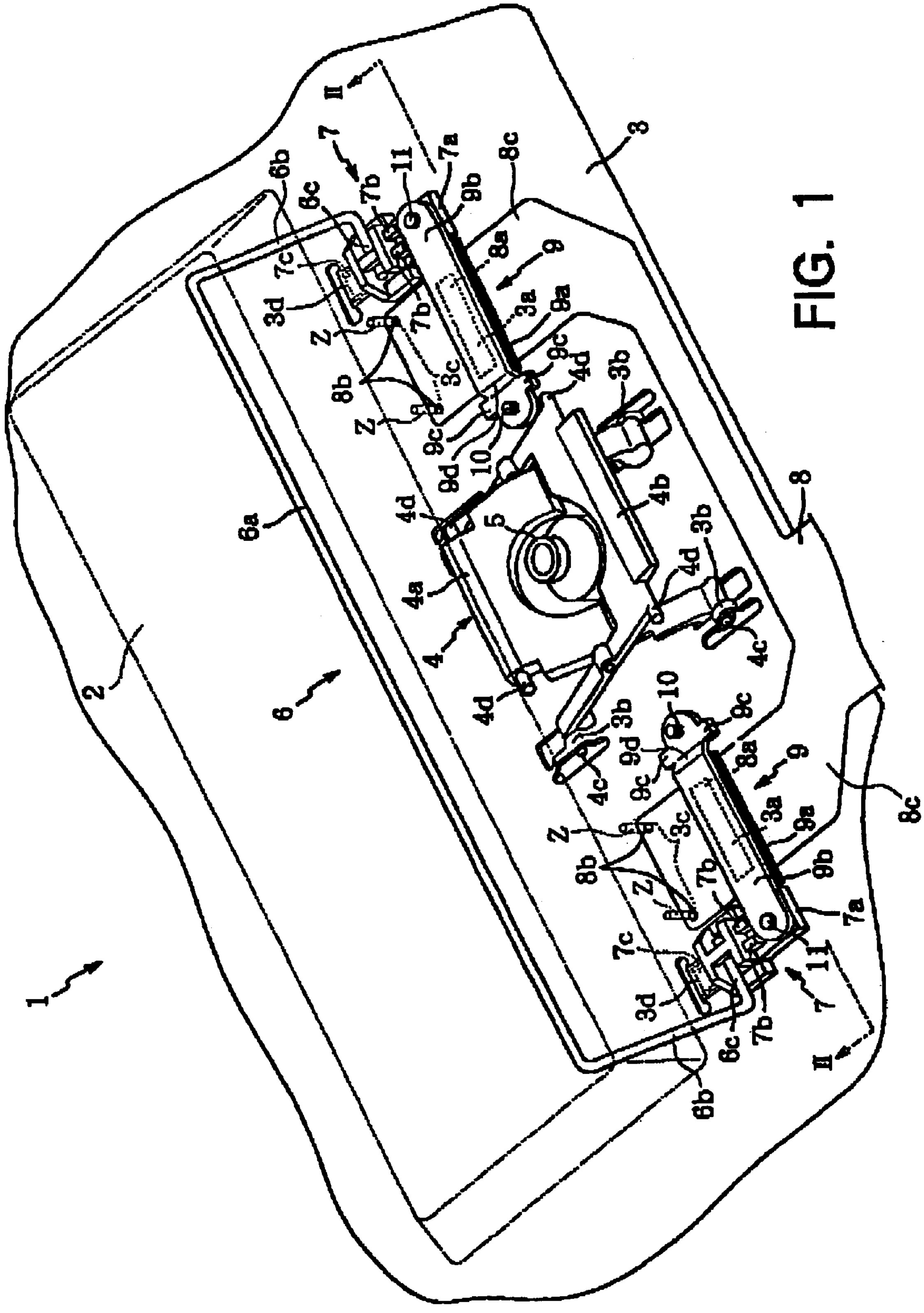
FIG. 1 is a perspective view partially in phantom showing an elongated keyswitch according to an embodiment of the present invention.

To achieve these objective, a keyswitch according to the present invention includes a keyboard base, an elongated keytop, a guide support member, a flexible circuit base, and a pressing member.

The keyboard base is printed with circuitry. The elongated keytop is disposed above the keyboard base and is longer in a lengthwise direction than in a widthwise direction. The guide support member is disposed below the keytop and guides vertical movement of the keytop.

The flexible circuit base is disposed adjacent, in the lengthwise direction, to the guide support member. The flexible circuit base is electrically connected to the circuitry of the keyboard base to transmit signals from the circuitry on the keyboard base to other circuitry.

The pressing member is disposed adjacent, in the lengthwise direction, to the guide support member at a position directly below the key top and presses the flexible circuit base towards the keyboard base.

Because the pressing member is disposed directly below the key top, at a position adjacent to the guide support member in the lengthwise direction of the key top, the pressing member is completely housed within the key top when the keytop is pressed down. Therefore, the pressing member and the guide support member do not interfere with each other when the key top is pressed down. As a result, a sufficiently long keystroke can be secured. Also, by locating the pressing member directly beneath the elongated keytop and using it to fixedly attach the flexible circuit board directly beneath the key top, there is no need to secure space on the keyboard base for fixedly attaching the flexible circuit board, other than space where the keyswitch itself is disposed. Accordingly, the keyboard base can be formed with a smaller surface area, so that the overall size of the personal computer can be reduced.

According to another aspect of the present invention, another flexible circuit base is disposed adjacent to the guide support member in an opposite direction opposite the lengthwise direction. Also, another pressing member is disposed adjacent to the guide support member in the opposite direction at a position directly below the key top. The other pressing member presses the other flexible circuit toward the keyboard base.

With this configuration, an even larger surface area can be secured on the keyboard base for pressing, that is, fixedly attaching, the flexible circuit board onto the keyboard base using the pressing member. Therefore, the flexible circuit board can be connected directly below the key top, even if the key top has a small size.

According to another aspect of the present invention, the keyboard base is formed with at least one through hole. Also, the flexible circuit base is formed with at least one positioning hole that overlaps with the at least one through hole in the keyboard base when the flexible circuit base is disposed at a proper fixing position on the flexible circuit base.

With this configuration, to assemble the keyswitch, rod-shaped jigs are inserted into the through holes formed at a predetermined position of the keyboard base. Next, the positioning holes formed on the flexible circuit board are aligned with the rod-shaped jigs and the flexible circuit board is fixed to the keyboard base. Because the through holes of the keyboard base and the positioning holes of the flexible circuit board are formed to overlap when the flexible circuit board is located at an appropriate fixing position, the flexible circuit board can be properly attached at a correct position on the keyboard base.

According to another aspect of the present invention, a metal wire member and a resin holder member are further provided to the keyswitch. The metal wire member includes a rotational shaft section and arm sections. The rotational shaft section is disposed rotatable with respect to the keytop at a position under the keytop. One of the arm sections extends from each end of the rotational axis section. Each arm section has a bent section that extends substantially parallel with the rotational shaft section starting from a predetermined distance from the rotational axis section. The resin holder member is for pivotably or slidably attaching the bent section of the wire member to the keyboard base.

With this configuration, when the key top is pressed down, the rotational axis portion of the metal wire member rotates with respect to the under surface of the key top and also the bent potion, which extends from both ends of the rotational axis portion, pivots or slides within the resin holder member, which is attached to the keyboard base. The key top can move vertically as a result. If both the wire member and the holder member were formed from metal, metal dust would be produced with these pivoting and sliding movements. The metal dust would form a potential cause of electric short circuits in the electric circuitry. However, because the holder portion is formed from resin, production of metal dust can be prevented.

According to another aspect of the present invention, a screw is provided for attaching both the pressing member and the holder member to the keyboard base. With this configuration, the number of screws for assembling the keyswitch can be reduced. Also, the holder member and the pressing member are attached to the keyboards base at the same time, so the number of assembly processes can be reduced. Therefore, manufacturing costs can be reduced.

According to another aspect of the present invention, the pressing member includes a resilient member and a metal plate. The resilient member is for pressing the flexible circuit base toward the keyboard base. The metal plate is for increasing pressing force of the resilient member. The metal plate has an end and an opposite end. The end and the keyboard base sandwich the holder member. The opposite end has a bend equivalent to the thickness of the holder member sandwiched between the one end and the keyboard base.

Because the metal plate is bent at the end that is opposite from the end nearest the holder member, by an amount equivalent to the thickness of the holder member, the holder member and the metal plate can be screwed together using a screw in an overlapping condition while adding pressing force of the metal plate to the pressing force of resilient body.

According to another aspect of the present invention, the holding member is formed with an interference member at a position adjacent, with respect to a particular direction, to the metal plate of the pressing member. Also, the metal plate is formed at the opposite end with two interference protrusions. One of the interference protrusions extends in the particular direction and the other of the interference protrusions extends in a direction opposite the particular direction.

With this configuration, even if the user attempts to attach the metal plate of the pressing member with left and right sides reversed by accident, on of the interference protrusions formed on the metal plate will interfere with the interference member formed on the holder member, so that the pressing member cannot be assembled improperly.

According to another aspect of the present invention, the holder member is formed, at a side thereof opposite from a side nearest the screw, with an engaging protrusion for entering under the keyboard. With this configuration, the engagement protrusion formed on the holder portion enters under the under surface of the keyboard base so that the holder member and the keyboard base are engaged together. As a result, the side of the end of the holder member opposite from the end with the screw can be prevented from lifting up toward the upper surface of the keyboard base.

According to another aspect of the present invention, the keyboard base is formed with an uplifted portion for receiving the engaging protrusion under the keyboard base. With this configuration, the engagement protrusion of the holder member will not protrude from the upper surface of the keyboard base, so that the keyboard base can be formed thin.

The keyswitch according to the present invention can be provided in a keyboard. With this configuration, there is no need to provide extra space for attaching the flexible circuit board on the keyboard base of the keyboard, other than space on which the keyswitch itself is disposed. Therefore, the keyboard base can be made with a smaller surface area and the keyboard can consequently be formed with a smaller surface area.

The above-described keyboard can be provided in an electric appliance that includes a display for displaying characters such as text and symbols, and a control portion for controlling the display to display characters according to input through the keyboard. Because the keyboard is formed with a small surface area, the portion of the electric appliance taken up by the keyboard is reduced, so that the overall size of the electric appliance can be reduced.

Next, an embodiment of the present invention will be described while referring to the attached drawings. FIG. 1 is a perspective view partially in phantom showing a keyswitch 1 according to the present embodiment.

The keyswitch 1 includes an elongated key top 2, a keyboard base 3, a guide support member 4, a rubber spring 5, a wire member 6, holder members 7, a flexible circuit board 8, and pressing members 9.

The keytop 2 is formed from a synthetic resin, such as ABS resin. Although not shown in the drawings, the under surface of the elongated key top 2 is formed with engagement portions for slidably and/or rotatably holding thereto the guide support member 4 and the wire member 6.

The keyboard base 3 is for supporting the elongated key top 2 and in disposed below the elongated key top 2. Although not shown in the drawings, the keyboard base 3 also supports a plurality of other key tops in the vicinity of the elongated key top 2. The keyboard base 3 is formed in a plate shape from metal, such as aluminum or steel, that can be flexibly deformed.

The keyboard base 3 has been subjected at its upper surface to resist printing to provide electric insulation. Contact points 3*a*, key contacts (not shown), and circuit patterns (not shown) are printed on the upper surface of the resist print in a conductive coating material, such as silver. As will be described later, the contact points 3*a* are electrically connected to pull-out contacts 8*a* of the flexible circuit board 8. The key contacts are for detecting a vertical switching movement of the key top 2. The circuitry is for electrically connecting the contact points 3*a* with the key contacts. To prevent short circuits and oxidation, the keyboard base 3 in also coated with resist print at positions an its upper surface other than where the key contact points and the contact points 3*a* are printed.

The keyboard base 3 in formed with holder portions 3*b* for securing the guide support member 4 to the keyboard base 3. The holding portions 3*b* are formed in by cutting holes in the keyboard base 3 and pressing up the keyboard base 3 into a curved shape.

The keyboard base 3 is formed with two uplifted portions 3*d* for engaging an engagement protrusion 7*c* of the holder member 7, to attach the holder member 7 onto the keyboard base 3. Each uplifted portion 3*d* is positioned directly behind one of the holder members 7, and is formed by opening two elongated holes in the keyboard base 3 and pressing the section between the two holes upward to form an uplifted area.

The guide support member 4 is disposed between the elongated key top 2 and the keyboard base 3. The guide support member 4 is for holding the elongated key top 2 on the keyboard base 3, and also for guiding vertical movement of the key top 2. The guide support member 4 includes substantially C-shaped first and second link members 4*a*, 4*b*. The first and second link members 4*a*, 4*b* are fitted together to intersect in a substantial X-shape, and can be folded down flat by pivoting movement about the intersection portion.

Each arm of the C-shaped first and second link members 4*a* are formed at the lower ends thereof with lower and protrusions 4*c*. Each of the lower end protrusions 3*c* is slidably or rotatably engaged in one of the holder portions 3*b*. Further, each crossbar portion of the C-shaped first and second link members 4*b* is formed at the upper end thereof with an upper and protrusion 4*d*. Each of the upper end protrusions 4*d* is slidably or rotatably engaged in one of a plurality of engagement portions (not shown) formed in the under surface of the elongated key top 2.

The guide support member 4 with this configuration guides vertical movement of the elongated key top 2 to constantly maintain the elongated key top 2 in parallel alignment with the keyboard base 3. Further, the first and second link members 4*a*, 4*b* of the guide support member 4 are completely folded flat when the elongated key top 2 is pressed completely down, thus providing the keyswitch 1 with a thin shape and ensuring a sufficiently large keystroke.

The rubber spring 5 in disposed at nearly the center of the guide support member 4. The rubber spring 5 in formed in a substantially hollow cylinder shape with a narrow diameter at the top and a wider diameter at the bottom. When the elongated key top 2 is pressed down, the under surface of the elongated key top 2 is pressed down directly on the rubber spring 5. When the rubber spring 5 buckles under the pressure from the elongated key top 2, key contacts (not shown) formed at the interior upper surface of the rubber spring 5 and printed on the upper surface of the keyboard base 3 will contact each other, resulting in a switching operation.

The wire member 6 is formed in a substantial C-shape, and includes a rotational axis portion 6*a*, two arms 6*b* and two bent ends 6*c*. The rotational axis portion 6*a* is rotatably engaged in an engagement portion (not shown) formed in the under surface of the elongated key top 2, and extends in a straight line from one lengthwise end of the elongated key top 2 to the other. The arms 6*b* are connected to either end of the rotational axis portion 6*a*. Each arm 6*b* bends at a location a predetermined distance from the rotational axis portion 6*a*, into substantial parallel alignment with the rotational axis portion 6*a*, thus forming the bent ends 6*c*. Each bent end 6*c* is rotatable or slidably attached to one of two holder members 7.

The metal wire member 6 is for preventing the elongated key top 2 from tilting in its lengthwise direction, That is, the elongated key top 2 has a length much greater than its width. On the other hand, the guide support member 4 is short compared to length of the elongated key top 2. Therefore, if the user presses down one extreme lengthwise end of the elongated key top 2, there is a possibility that the elongated key top 2 will tilt without performing a proper switching operation.

Because the wire member 6 is rotatably disposed under the elongated key top 2, even if the elongated key top 2 is pressed down at one extreme lengthwise end, the downward pressure will be uniformly dispersed across the entire length of the elongated key top 2. Therefore, the elongated key top 2 can be moved vertically without any tilt along its length.

The holder members 7 are for pivotably attaching the wire member 6 to the keyboard base 3. The holder members 7 are attached on the keyboard base 3 at positions in confrontation with lengthwise ends of the elongated key top 2. The holder members 7 each include a plate-shaped overlapping plate 7*a* that extends under a metal plate 9*b* of the corresponding pressing member 9, to the front edge of the metal plate 9*b*. In this way, the overlapping plate 7*a* separates the metal plate 9*b* from the keyboard base 3 by thickness of the overlapping plate 7*a*.

The holder members 7 are formed from resin, as opposed to the metal of the wire member 6. If both the wire member 6 and the holder members 7 were formed from metal, then pivoting or sliding movement between the two would generate metal dust, which could become a source of electronic short-circuiting in the electronic circuit on the keyboard. However, because the holder member 7 is formed from resin, no metal dust will be generated by the pivoting or sliding movement between the wire member 6 and the holder member 7.

Figure 4:
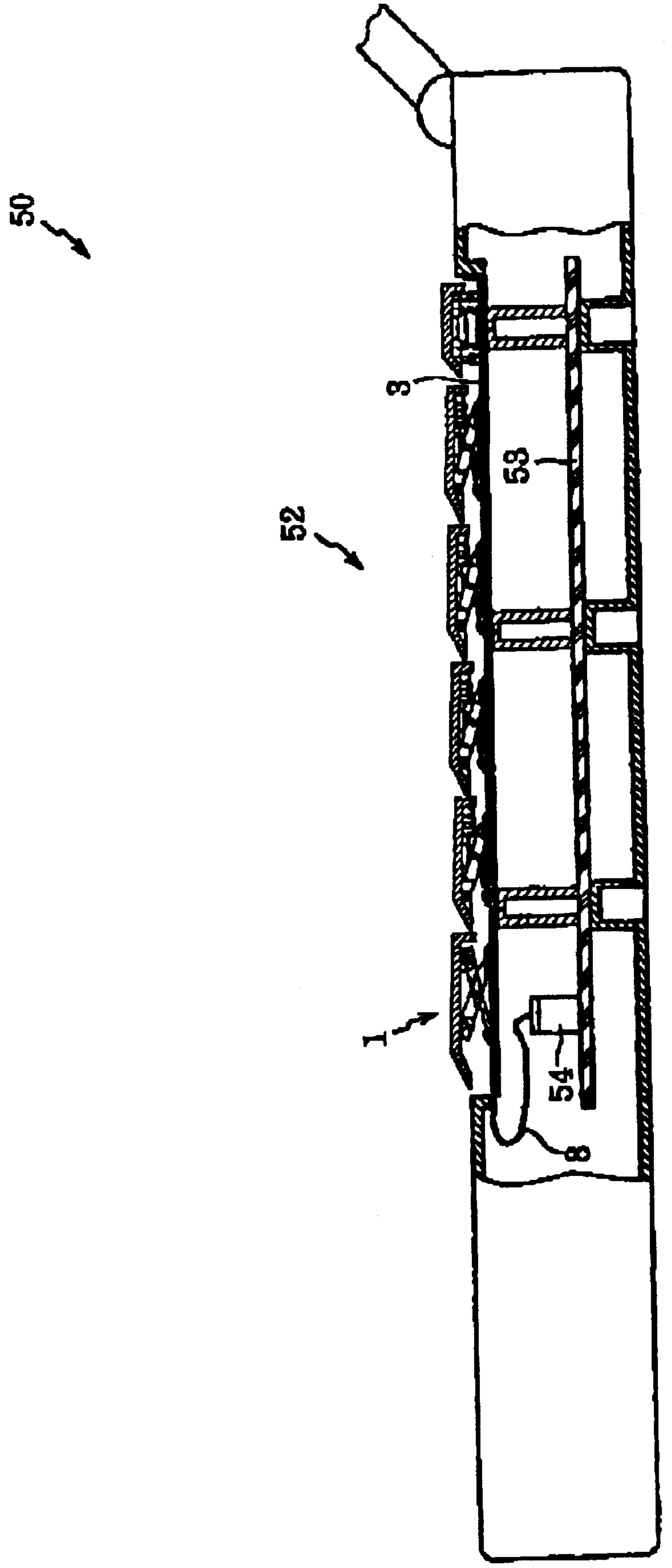
FIG. 4 in a cross-sectional view taken along line IV—IV of FIG. 3.

The flexible circuit board 8 extends below both ends of the elongated key top 2, on either side of the guide support member 4. As shown in FIG. 4, the film shaped flexible circuit board 8 is mechanically and electrically connected to a circuit board 53 of a personal computer 50 by a connector 54. Other circuitry is printed on the circuit board 53. The flexible circuit board 8 is for transmitting electric signals from the keyboard base 3 to the circuitry on the circuit board 53. The flexible circuit board 8 is formed from polyester film, for example, which has electrically insulating properties. A circuit pattern is printed interior of the polyester film from a conductive coating material, such as silver.

The flexible circuit board 8 is divided into two arms 8*c* directly in front of the guide support member 4. The arms 8*c* extend to opposite sides of the guide support member 4, and are attached to the keyboard base 3 by one of the pressing members 9. The pull-out contacts 8*a* are exposed from the under surface of each arm 8*c* at a position directly beneath the pressing members 9. The pull-out contacts 8*a* are for transmitting electrical signals from the keyboard base 3 to the flexible circuit board 8.

Each of the contact points 3*a* is exposed at the upper surface of the keyboard base 3 at a position directly under one of the pressing members 9. When the pull-out contacts 8*a* the flexible circuit board 8 are pressed against the contact points 3*a*, the keyboard base 3 and the flexible circuit board 8 become electrically connected. As a result, electric signals from the keyboard base 3 are transmitted to the circuitry of the personal computer.

In this way, the flexible circuit board 8 is attached to the keyboard base 3 at either side of the guide support member 4 by pressure from the pressing members 9. Therefore, a broad surface area can be secured for pressing, that is, fixedly attaching, the flexible circuit board 8 to the keyboard base 3. Therefore, the flexible circuit board can be connected directly beneath the key top 2, even if the key top 2 is formed in a relatively small size.

Two positioning holes 8*b* are formed to each arms 8*c* of the flexible circuit board 8, near the ends of the arms 8*c*. The holes 8*b* penetrate completely through the arms 8*c* of the flexible circuit board 8. Through holes 3*c* are formed in the keyboard base 3 at positions overlapping with the positioning holes 8*b* of the flexible circuit board 8. The through holes 3*c* are for attaching the flexible circuit board 8 to the keyboard base 3, and penetrate completely through the keyboard base 3.

The two arms 8*c* of the flexible circuit board 8 are fixedly attached to the upper surface of the keyboard base 3 by inserting rod shaped jigs Z, which are shown in two dotted chain line in FIG. 1, into the through holes 3*c* from the under surface of the keyboard base 3. Then, the flexible circuit board 8 is lowered down while aligning the positioning holes 8*b*of the flexible circuit board 8 with the jigs Z. As a result, the pull-out contact 8*a* of the flexible circuit board 8 will be properly positioned with respect to the contact point 3*a* of the keyboard base 3. Therefore, the contact points 3*a* and the holder portions 3*b* will be brought into proper electrical connection when they contact each other.

In this way, the through holes 3*c* of the keyboard base 3 and the positioning holes 8*b* of the flexible circuit board 8 are formed so that they will overlap when the flexible circuit board 8 is positioned properly on the keyboard base 3. Therefore, even if the flexible circuit board 8 is divided into two branches as in the present embodiment, the flexible circuit board 8 can be fixedly attached at a proper position on the keyboard base 3 so that the pull-out contacts 8*a* of both arms 8*c* of the flexible circuit board 8 will properly contact the contact points 3*a* of the keyboard base 3.

The pressing members 9 include a resilient body 9*a* and a metal plate 9*b*. Each resilient body 9*a* is for pressing the corresponding arm 8*c* of the flexible circuit board 8 toward the keyboard base 3. The metal plates 9*b* are for increasing pressing force of the resilient bodies 9*a* against the keyboard base 3. The metal plates 9*b* are each formed in an elongated shape with rounded ends. As mentioned above, one end of each metal plate 9*b* is disposed over the overlapping plate 7*a* of the corresponding holder member 7. A bend 9*d* is formed near the other end of each metal plate 9*b*, that is, near the end opposite the end at the overlapping plate 7*a*. Each bend 9*c* is equivalent to the thickness of the corresponding overlapping plate 7*a*. Each resilient body 9*a* is disposed beneath the corresponding metal plate 9*b*, at a position nearer the center of the metal plate 9*b* than the bend 9*d*, and so presses the flexible circuit board 8, and particularly the pull-out contacts 8*a*, toward the keyboard base 3.

Each metal plate 9*b* is screwed at its end that is opposite the end near the holder member 7, directly onto the keyboard base 3, by a first screw 10. In contrast to this, the end of each metal plate 9*b* that is nearer the holder member 7 is screwed onto the keyboard base 3 by a second screw 11, but with the overlapping plate 7*a* of the holder member 7 sandwiched between the metal plate 9*b* and the keyboard base 3. That is to say, the overlapping plate 7*a* extends from the holder member 7 In between the metal plate 7*b* and the keyboard base 3, and the second screw 11 screws together the metal plate 3*b*, the overlapping plate 7*a*, and the keyboard base 3.

Because each metal plate 9*b* in bent by the thickness of the overlapping plate 7*a* at the bend 9*d*, which in at the end opposite from the end nearest the holder member 7, the holder member 7 and the metal plate 9*b* can be stacked onto each other and fastened together onto the keyboard base 3 using the same screw 11, while adding the pressing force of the metal plate 9*b* to that of the resilient member 9*a*.

Accordingly, the holder member 7 is attached to the keyboard base 3 by the second screw 11, which is for attaching the pressing member 9 to the keyboard base 3. Therefore, there is no need for providing a separate screw for attaching the holder member 7. As a result, the number of holding screws can be reduced. Also, the number of assembly procedures can be reduced because the holder member 7 and the pressing member 9 are attached to the keyboard base 3 at the same time. Therefore, production costs can be reduced.

The upward-protruding interference members 7*b* are formed on the upper surface of each overlapping plate 7*a*, at a position in contact with a side edge of the corresponding metal plate 9*b*. On the other hand, an interference protrusion 9*c* is formed at the opposite side of the metal plate 9*b* in the vicinity of the first screw 10.

If when assembling the keyswitch 1, an assembler attempts to mount the pressing member 9 onto the keyboard base 3 with the metal plate 9*b* oriented with left and right ends facing the opposite directions, the interference members 7*b* formed on the holder member 7 will bump against the interference protrusions 9*c*; so that the assembler will be unable to screw the holder member 7 and the metal plate 9*b* onto the keyboard base 3. This prevents assemblers from attaching the pressing member 9 with the wrong orientation when assembling the keyswitch 1.

One of the engagement protrusions 7*c*, Which are for engaging the holder member 7 onto the keyboard base 3, extends from a rear side of each holder member 7, that is, from the side opposite the side nearer the second screw 11 as viewed in plan. To attach the holder member 7 to the keyboard base 3, the engagement protrusion 7*c* of the holder member 7 is inserted under and engaged with the uplifted portion 3*d* of the keyboard base 3. Next, the holder member 7 and the metal plate 9*b* are screwed onto the keyboard base 3 using the second screw 11.

The engagement protrusion 7*c* of the holder member 7 enters under the under surface of the keyboard base 3 so that the holder member 7 becomes engaged with the keyboard base 3. As a result, even when this elongated key top 2 is pressed down so that the wire member 6 pivots on the holder member 7, the end of the holder member 7 opposite, with respect to the plan view, from the end nearest the second screw 11 is prevented from pulling away from the upper surface of the keyboard base 3.

Because the uplifted portion 3*d* for engaging with the engagement protrusion 7*c* of the holder member 7, is formed by pressing up a portion of the keyboard base 3 in the direction of the upper surface of the keyboard base 3, there is no need for the engagement protrusion 7*c* of the holder member 7 to protrude toward the under surface of the keyboard base 3. Accordingly the keyboard base 3 can be formed in a thin shape.

Figure 2:
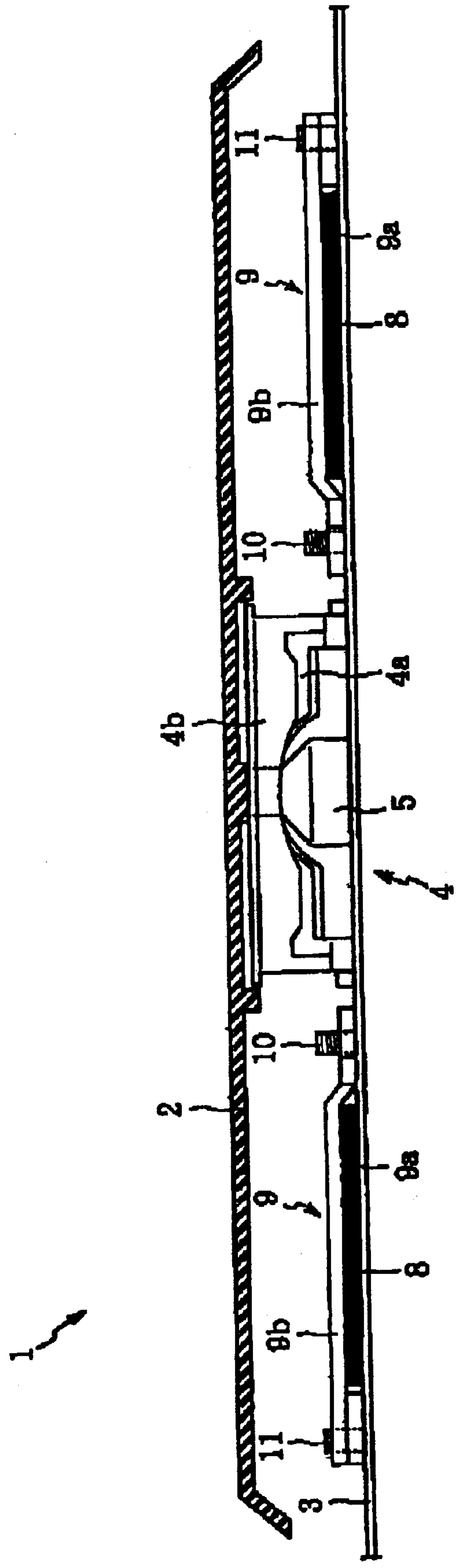
FIG. 2 (*a*) is a cross-sectional view taken along line II—II of FIG. 1 with a keytop of the keyswitch in a raised condition.
Figure 2:
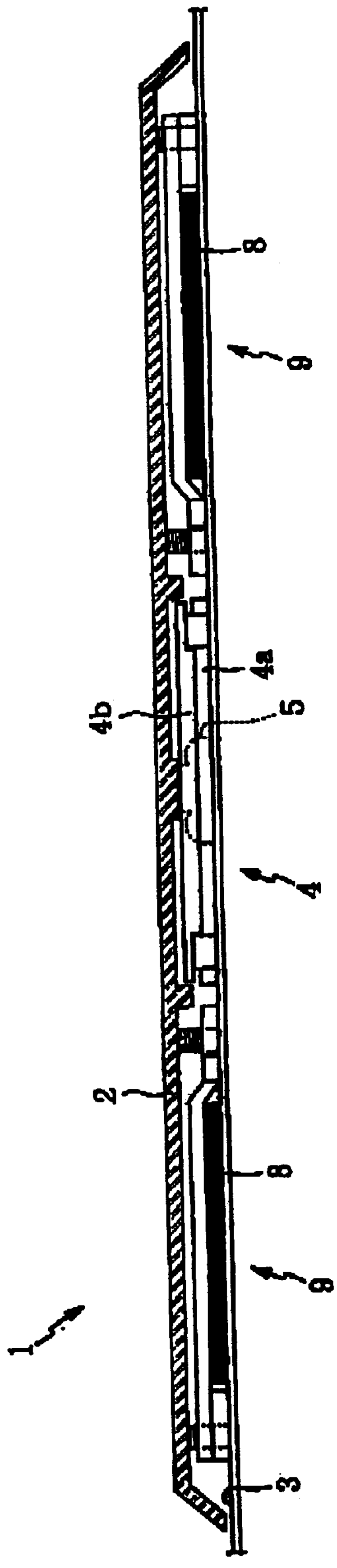

Next, an operation of the keyswitch 1 will be described while referring the FIGS. 2(*a*) and 2(*b*). FIGS. 2(*a*) and 2(*b*) are cross-sectional views taken along a line II—II of FIG. 1. FIG. 2(*a*) shows the keyswitch 1 with the elongated key top 2 not yet pressed down. FIG. 2(*b*) shows the elongated key top 2 with the elongated key top 2 pressed down. To make the drawings easier to understand, the wire member 6 has been omitted from the FIGS. 2(*a*) and 2(*b*).

As shown in FIG. 2(*a*), when the elongated key top 2 is not pressed down, the elongated key top 2 is pressed upward by upward urging force of the rubber spring 5. That is, the under surface of the elongated key top 2 is mounted on the upper surface of the rubber spring 5, and urging force of the rubber spring 5 extends the guide support member 4 into its extended condition, with the arms of the first and second link members 4*a*, 4*b* as close together as possible. As a result, the elongated key top 2 is lifted upward.

When the elongated key top 2 is pressed downward, the protrusions 4*a*, 4*d* shown in FIG. 1 pivot or slide with respect to the holder portion 3*b* formed on the keyboard base 3 and an engagement portion (not shown) on the under surface of the elongated key top 2, respectively. An a result, the first and the second link members 4*a*, 4*b* spread apart in the manner of a pair of scissors, so that the elongated key top 2 moves downward with its horizontal posture properly maintained.

When the elongated key top 2 moves downward in this manner, the under surface of the elongated key top 2 gradually presses down on the rubber spring 5. Then the elongated key top 2 is further pressed down, the upper surface at the interior of the rubber spring 5 contacts a key contact point (not shown) printed on the upper surface of the keyboard base 3, resulting in an ON switching operation. As shown in FIG. 2(*b*), when the elongated key top 2 is completely pressed down, the pressing member 9 for pressing the flexible circuit board 8 toward the keyboard base 3, will be housed completely within the elongated key top 2.

When the elongated key top 2 is released, the under surface of the elongated key top 2 will be pressed upward by the urging force of the rubber spring 5. When the under surface of the elongated key top 2 is raised upward in this manner, the upper end protrusions 4*d* and the lower end protrusions 4*c* of the guide support member 4 pivot or slide with respect to the engagement portion at the under surface of the key top and the holder portion 3*b* formed in the keyboard base 3. As a result, the first and second link members 4*a*, 4*b* will clone in the manner of a pair of scissors, so that the elongated key top 2 is lifted upward with its horizontal posture properly maintained, until the elongated key top 2 returns to the unpressed position shown in FIG. 2(*a*).

As described above, the pressing members 9 press the arms 8*c*, which are disposed on either side of the guide support member 4, toward the keyboard base 3. The pressing members 9 on both sides of the guide support member 4 are directly under both of the lengthwise ends of the elongated key top 2. Therefore, when the elongated key top 2 is pressed down, the guide support member 4 and the pressing members 9, which are disposed on both sides of the guide support member 4, are completely housed within the elongated key top 2. With this configuration, the guide support member 4 and the pressing members 9 will not interfere with downward movement of the elongated key top 2. Therefore, a sufficient keystroke can be secured. Also, the pressing members 9 are disposed directly beneath the elongated key top 2 and fixedly attracted to the flexible circuit board 8 directly beneath the elongated key top 2. As a result, there in no need to provide extra space on the keyboard base 3 for attaching the flexible circuit board 8 at areas other than where the keyswitch 1 itself is positioned. Therefore, the surface area of the keyboard base 3 can be made smaller overall, so that the personal computer can be made smaller.

While the invention has been described in detail with reference to specific embodiments thereof, it would be apparent to those skilled in the art that various changes and modifications may be made therein without departing from the spirit of the invention, the scope of which is defined by the attached claims.

For example, the keyswitch 1 can be included in any keyboard, and the keyboard can be provided to any electric appliance, such as a personal computer. There is no particular limitation to the type of personal computer that the keyswitch is provided to. For example, the personal computer can be a desktop type, a lap top type, a notebook type, or a hand held type personal computer. Also, the electric appliance can be any type that includes a keyboard with keyswitches. For example, the keyswitch 1 according to the present embodiment can be provided to any electric appliance, such as a word processor or a label printer that has a keyboard.

Figure 3:
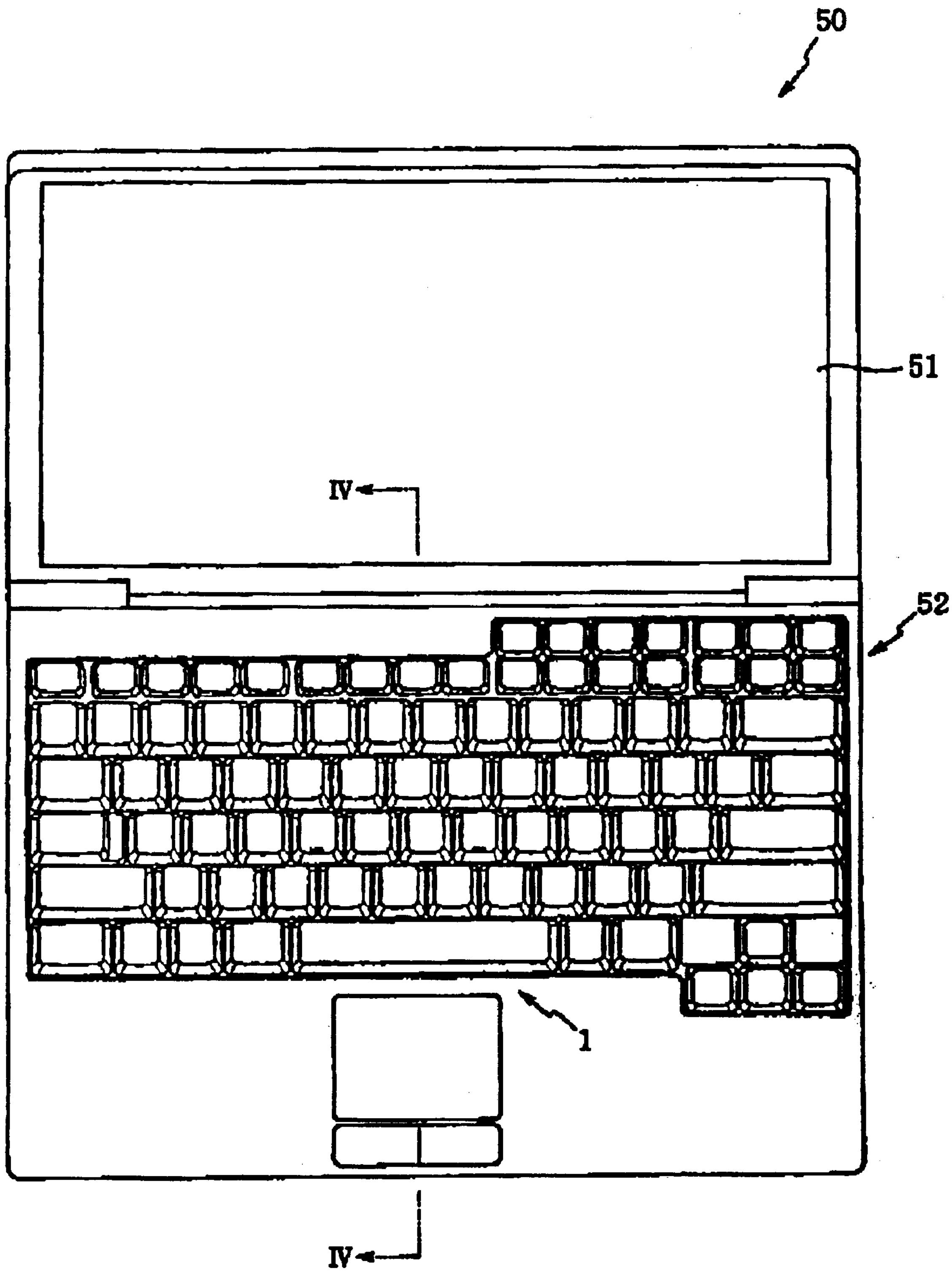
FIG. 3 is a plan view showing a computer including a keyboard with the keyswitch of FIG. 1.
Figure 5:
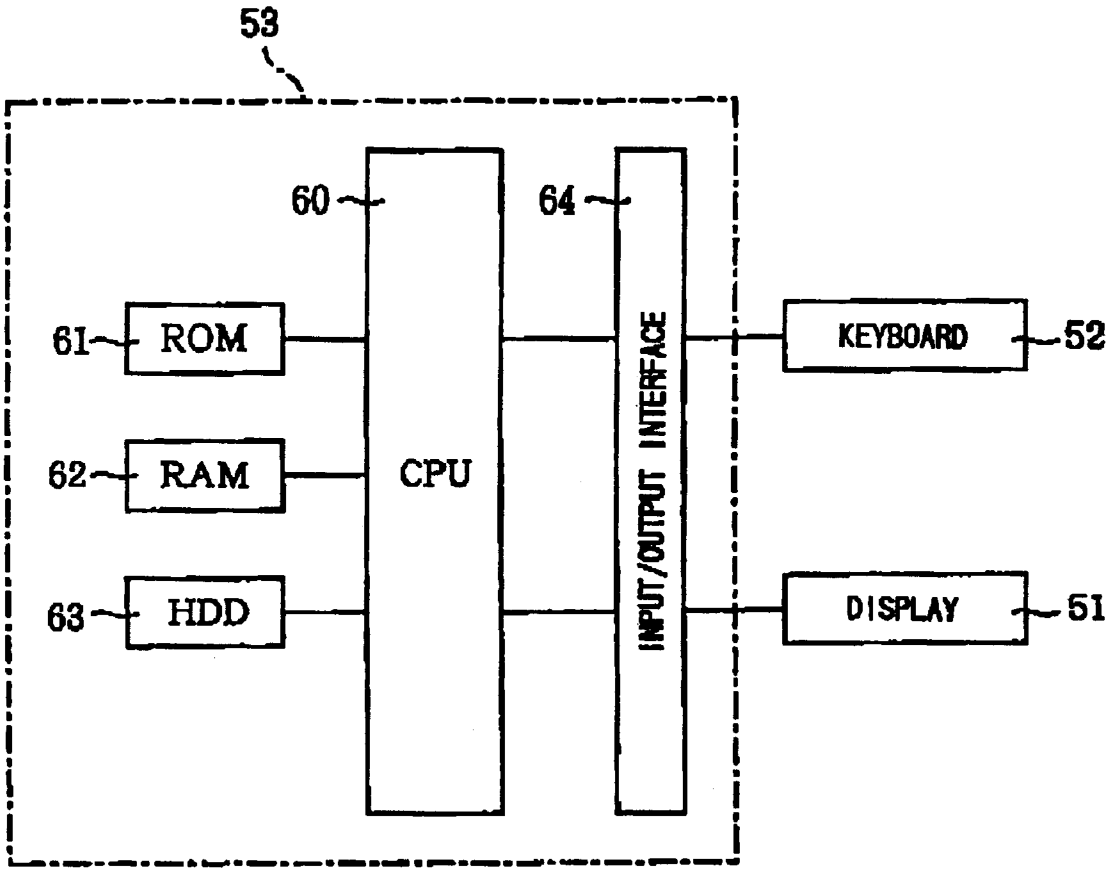
FIG. 5 is a block diagram showing electronic configuration of the computer of FIG. 3.

FIGS. 3 to 5 show a notebook type personal computer 50 as an example of an electric appliance to which the present invention can be applied. The personal computer 50 includes a keyboard 52 and an electric crystal display 51. The keyboard 52 is provided with the keyswitch 1 of the above-described embodiment. FIG. 3 shows the personal computer 50 with the electric crystal display 51 in an open condition. The keyboard 52 is provided with a plurality of keyswitches for inputting characters, such as text and symbols. The keyswitch 1 is disposed in substantially the center of the first row of the keyswitches on the personal computer 50 and serves as a space bar.

FIG. 4 is a cross-sectional view taken along line IV—IV of FIG. 3. As shown in FIG. 4, the keyboard 52 includes the keyboard base 3, and is disposed at the upper surface of the personal computer 50. The circuit board 53 is disposed inside the personal computer 50 below the keyboard 52. The circuit board 53 has a plate shape, and is provided with circuitry, such as a central processing unit (CPU) 60 shown in FIG. 5. The CPU 60 is for performing control operations and calculations of the personal computer 50.

Next, configuration of the circuit board 53 will be explained while referring to FIG. 5. FIG. 5 is a block diagram showing electronic configuration of the circuit board 53. The circuit board 53 includes the CPU 60, a ROM 61, a RAM 62, and a hard disk drive 63. The ROM 61 is for storing fixed value data and basic programs executed by the CPU 60. The RAM 62 is used as a work memory, for example. The hard disk drive 63 stores a variety of data and application programs. The CPU 60 is also connected to the electric crystal display 51 on the keyboard 52 through an input/output interface 64.

As shown in FIG. 4, the film shaped flexible circuit board 8 is attachedly fixed beneath the keyswitch 1 and electrically connects the keyboard base 3 to the circuit board 53 via the connector 54. Electric signals from the keyboard 52 are transmitted to the circuit board 53 of the personal computer 50 through the flexible circuit board 8. The CPU 60 controls the electric crystal display 51 to display characters inputted through the keyboard 52, retrieves data and programs from the hard disk drive 63, and performs other operations.

In this way, the keyboard 52 with the keyswitch 1 is provided in the personal computer 50. Because it is provided with the keyswitch 1, the keyboard base 3 has a smaller surface area. The keyboard 52 can be made smaller by the amount that the surface are of the keyboard base 3 reduced. As a result, the portion of the personal computer 50 taken up by the surface area of the keyboard 52 can be reduced so that the overall size of the personal computer 50 can be reduced.

What is claimed is:

1. A keyswitch for a keyboard, comprising:

a keyboard base having one or more contact points;

an elongated keytop that is disposed above the keyboard base and that is longer in a lengthwise direction than in a widthwise direction;

a guide support member that is disposed below the keytop and that guides vertical movement of the keytop;

a flexible circuit board that is disposed adjacent in the lengthwise direction, to the guide support member, the flexible circuit board including one or more pull-out contacts that are located directly above the contact points of the keyboard base and that are for electrically connecting to the contact points of the keyboard base to transmit signals from the contact points on the keyboard base; and a pressing member that is disposed adjacent, in the lengthwise direction, to the guide support member at a position directly below the keytop and that presses the pull-out contacts of the flexible circuit board against the contact points of the keyboard base to fixedly attach the flexible circuit board to the keyboard base, thereby maintaining the pull-out contacts of the flexible circuit board in constant electrical contact with the contact points of the keyboard base.

2. A keyswitch as claimed in claim 1, further comprising:

another flexible circuit base disposed adjacent to the guide support member in an opposite direction opposite the lengthwise direction; and another pressing member disposed adjacent to the guide support member in the opposite direction at a position directly below the key top, the other pressing member pressing the other flexible circuit toward the keyboard base.

3. A keyswitch as claimed in claim 1, wherein:

the keyboard base is formed with at least one through hole; and the flexible circuit base is formed with at least one positioning hole that overlaps with the at least one through hole in the keyboard base when the flexible circuit base is disposed at a proper fixing position on the flexible circuit base.

4. A keyswitch as claimed in claim 1, further comprising:

a metal member having:

a rotational shaft section disposed rotatable with respect to the keytop at a position under the keytop; and arm sections, one of the arm sections extending from each end of the rotational axis section, each arm section having a bent section that extends substantially parallel with the rotational shaft section starting from a predetermined distance from the rotational axis section; and a resin holder member for pivotably or slidably attaching the bent section of the wire member to the keyboard base.

5. A keyswitch as claimed in claim 4, further comprising a screw that attaches both the pressing member and the holder member to the keyboard base.

6. A keyswitch an claimed in claim 5, wherein the pressing member includes:

a resilient member for pressing the flexible circuit base toward the keyboard base; and a metal plate for increasing pressing force of the resilient member, the metal plate having an end an opposite end, the end and the keyboard base sandwiching the holder member, the opposite end having a bend equivalent to thickness of the holder member sandwiched between the one end and the keyboard base.

7. A keyswitch an claimed in claim 6, wherein:

the holding member is formed with an interference member at a position adjacent, with respect to a particular direction, to the metal plate of the pressing member; and the metal plate is formed at the opposite end with two interference protrusions, one of the interference protrusions extending in the particular direction and the other of the interference protrusions extending in a direction opposite the particular direction.

8. A keyswitch as claimed in claim 5, wherein the holder member is formed, at a side thereof opposite from a side nearest the screw, with an engaging protrusion for entering under the keyboard.

9. A keyswitch as claimed in claim 8, wherein the keyboard base is formed with an uplifted portion for receiving the engaging protrusion under the keyboard base.

10. A keyboard comprising:

a keyboard base having one or more contact points; and a keyswitch including:

an elongated keytop that is disposed above the keyboard base and that is longer in a lengthwise direction than in a widthwise direction;

a guide support member that is disposed below the keytop and that guides vertical movement of the keytop;

a flexible circuit board that is disposed adjacent in the lengthwise direction, to the guide support member, the flexible circuit board including one or more pull-out contacts that are located directly above the contact points of the keyboard base and that are for electrically connecting to the contact points of the keyboard base to transmit signals from the contact points on the keyboard base; and a pressing member that is disposed adjacent, in the lengthwise direction, to the guide support member at a position directly below the keytop and that presses the pull-out contacts of the flexible circuit board against the contact points of the keyboard base to fixedly attach the flexible circuit board to the keyboard base, thereby maintaining the pull-out contacts of the flexible circuit board in constant electrical contact with the contact points of the keyboard base.

11. An electrical appliance comprising:

a keyboard including:

a keyboard base with one or more contact points; and a keyswitch including:

an elongated keytop that is disposed above the keyboard base and that is longer in a lengthwise direction than in a widthwise direction;

a guide support member that is disposed below the keytop and that guides vertical movement of the keytop;

a flexible circuit board that is disposed adjacent, in the lengthwise direction, to the guide support member, the flexible circuit board including one or more pull-out contacts that are located directly above the contact points of the keyboard base and that are for electrically connecting to the contact points of the keyboard base to transmit signals from the contact points on the keyboard base; and a pressing member that is disposed adjacent, in the lengthwise direction, to the guide support member at a position directly below the keytop and that presses the pull-out contacts of the flexible circuit board against the contact points of the keyboard base to fixedly attach the flexible circuit board to the keyboard base, thereby maintaining the pull-out contacts of the flexible circuit board in constant electrical contact with the contact points of a keyboard base;

a display for displaying characters; and a control portion for controlling the display to display characters according to input through the keyboard.

* * * * *